United States Patent
Seo et al.

(10) Patent No.: US 7,656,124 B2
(45) Date of Patent: Feb. 2, 2010

(54) BATTERY MANAGEMENT SYSTEM AND DRIVING METHOD THEREOF

(75) Inventors: Se-Wook Seo, Suwon-si (KR); Soo-Seok Choi, Suwon-si (KR)

(73) Assignee: Samsung SDI Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 325 days.

(21) Appl. No.: 11/480,532

(22) Filed: Jul. 5, 2006

(65) Prior Publication Data

US 2007/0024242 A1   Feb. 1, 2007

(30) Foreign Application Priority Data

Jul. 29, 2005   (KR) .................. 10-2005-0069481

(51) Int. Cl.
*H02J 7/00* (2006.01)
*H02J 7/06* (2006.01)
*H02J 7/16* (2006.01)

(52) U.S. Cl. .................. 320/133; 320/132; 320/155; 320/156; 320/157; 320/158

(58) Field of Classification Search .............. 320/132, 320/133, 135
See application file for complete search history.

(56) References Cited

U.S. PATENT DOCUMENTS

| | | | |
|---|---|---|---|
| 5,153,496 A | 10/1992 | LaForge | |
| 5,321,627 A | 6/1994 | Reher | |
| 5,666,040 A | 9/1997 | Bourbeau | |
| 5,701,068 A | 12/1997 | Baer et al. | |
| 5,773,962 A | 6/1998 | Nor | |
| 5,796,334 A | 8/1998 | Chen et al. | |
| 5,952,815 A | 9/1999 | Rouillard et al. | |
| 6,014,013 A | 1/2000 | Suppanz et al. | |
| 6,078,165 A | 6/2000 | Ashtiani et al. | |

(Continued)

FOREIGN PATENT DOCUMENTS

CN   1415973   5/2003

(Continued)

OTHER PUBLICATIONS

State of charge http://en.eikipedia.org/wiki/State_of_charge.

(Continued)

*Primary Examiner*—Edward Tso
*Assistant Examiner*—Yalkew Fantu
(74) *Attorney, Agent, or Firm*—Robert E. Bushnell, Esq.

(57) ABSTRACT

A battery management system includes a sensing unit, a controller, an Open Circuit Voltage (OCV) calculator, and a State of Charge (SOC) determination unit. The sensing unit measures a total voltage of the secondary battery. The controller maintains the secondary battery in an open circuit state for a first period of time after a power supply switch is turned on, and couples the secondary battery to an external device when the first period of time ends. The OCV calculator receives the measured voltage from the sensing unit and calculates an OCV of the secondary battery during the first period of time. The SOC determination unit receives the calculated OCV from the OCV calculator and determines an SOC corresponding to the OCV.

10 Claims, 3 Drawing Sheets

U.S. PATENT DOCUMENTS

| | | | |
|---|---|---|---|
| 6,104,166 A | 8/2000 | Kikuchi et al. | |
| 6,127,806 A | 10/2000 | Tanjo et al. | |
| 6,157,169 A * | 12/2000 | Lee | 320/132 |
| 6,255,826 B1 | 7/2001 | Ohsawa et al. | |
| 6,300,763 B1 | 10/2001 | Kwok | |
| 6,336,063 B1 | 1/2002 | Lennevi | |
| 6,472,880 B1 | 10/2002 | Kang | |
| 6,621,250 B1 | 9/2003 | Ohkubo et al. | |
| 6,639,409 B2 | 10/2003 | Morimoto et al. | |
| 6,803,766 B2 | 10/2004 | Kobayashi et al. | |
| 7,126,342 B2 | 10/2006 | Iwabuchi et al. | |
| 2001/0035737 A1 | 11/2001 | Nakanishi et al. | |
| 2002/0030494 A1 | 3/2002 | Araki et al. | |
| 2002/0113595 A1 | 8/2002 | Sakai et al. | |
| 2003/0025481 A1* | 2/2003 | Bertness | 320/155 |
| 2003/0146737 A1* | 8/2003 | Kadouchi et al. | 320/132 |
| 2003/0189419 A1 | 10/2003 | Maki et al. | |
| 2004/0109274 A1 | 6/2004 | Sato | |
| 2005/0156603 A1 | 7/2005 | Lin et al. | |
| 2006/0028179 A1 | 2/2006 | Yudahira et al. | |
| 2006/0181245 A1 | 8/2006 | Mizuno et al. | |
| 2006/0202663 A1 | 9/2006 | Cho et al. | |
| 2007/0090802 A1 | 4/2007 | Seo | |
| 2007/0090803 A1 | 4/2007 | Yun et al. | |
| 2008/0077339 A1 | 3/2008 | Seo et al. | |
| 2008/0091364 A1 | 4/2008 | Lim et al. | |

FOREIGN PATENT DOCUMENTS

| | | |
|---|---|---|
| CN | 1604383 A | 4/2005 |
| EP | 0 990 913 | 4/2000 |
| EP | 1 081 499 | 3/2001 |
| EP | 1 203 964 | 5/2002 |
| JP | 06-231806 | 8/1994 |
| JP | 11-160367 | 6/1999 |
| JP | 2000-069606 | 3/2000 |
| JP | 2000-134705 | 5/2000 |
| JP | 2000-217261 | 8/2000 |
| JP | 2000-228832 | 8/2000 |
| JP | 2000-324702 | 11/2000 |
| JP | 2000-357541 | 12/2000 |
| JP | 2001-086656 | 3/2001 |
| JP | 2001-272444 A | 10/2001 |
| JP | 2002-042906 | 2/2002 |
| JP | 2002-189066 A | 7/2002 |
| JP | 2002-199510 | 7/2002 |
| JP | 2002-272011 A | 9/2002 |
| JP | 2003-084015 | 3/2003 |
| JP | 2003-134675 | 5/2003 |
| JP | 2004-079324 | 3/2004 |
| JP | 2004-222433 | 8/2004 |
| JP | 2005-269752 | 9/2005 |
| JP | 2006-047130 | 2/2006 |
| KR | 10-1992-0009697 | 2/1991 |
| KR | 1998-064646 | 7/1998 |
| KR | 10-2002-0064998 | 8/2002 |
| KR | 10-2004-0005133 | 1/2004 |
| KR | 10-2004-0092943 | 11/2004 |
| KR | 10-2004-0111144 | 12/2004 |
| KR | 10-2005-0026360 | 3/2005 |
| KR | 10-2005-0089816 | 9/2005 |
| KR | 10-2006-0079505 | 7/2006 |
| KR | 10-2007-0003628 | 1/2007 |
| KR | 10-2007-0029937 | 3/2007 |

OTHER PUBLICATIONS

Custom Power Solutions http://www.mpoweruk.com/soc.htm.
Request for Entry of the Accompanying References.

* cited by examiner

BATTERY MANAGEMENT SYSTEM AND DRIVING METHOD THEREOF

CLAIM OF PRIORITY

This application makes reference to, incorporates the same herein, and claims all benefits accruing under 35 U.S.C. §119 from an application for METHOD FOR ESTIMATING SOC OF SECONDARY BATTERY MODULE, earlier filed in the Korean Intellectual Property Office on the 29 of Jul. 2005 and there duly assigned Serial No. 10-2005-0069481.

BACKGROUND OF THE INVENTION

1. Field of the Invention

The present invention relates to a management system of a secondary battery module. More particularly, the present invention relates to a secondary battery module management system for precisely calculating a State of Charge (SOC), and a driving method thereof.

2. Description of the Related Art

Recently, high power secondary batteries using non-aqueous electrolytes having a high energy density have been developed, and a large capacity secondary battery is formed by coupling a plurality of high output secondary batteries in series so that the secondary battery can operate an apparatus requiring high power, such as a motor of an electric vehicle.

As described, one large capacity secondary battery (hereinafter, referred to as a battery module for convenience of description) includes a plurality of secondary batteries (hereinafter referred to as unit batteries) coupled in series.

In the above battery module, more specifically, in a secondary battery module for a Hybrid Electric Vehicle (HEV), several to tens of unit batteries are alternately recharged and discharged, and therefore it is necessary to control a charge/discharge operation of the battery modules so as to maintain them in an appropriate operational state.

Accordingly, the battery module for the HEV detects voltage, current, and temperature of the unit batteries, estimates the State of Charge (SOC), and performs an SOC control operation so as to increase power consumption efficiency of a vehicle. In this case, an SOC level is required to be controlled for a good balance of a power assist operation for driving a motor during an acceleration of a vehicle and an energy recovery operation (regenerative braking) during a deceleration of the vehicle. Accordingly, the battery module is controlled so that the SOC level is within a range of from 50% to 70%. When the SOC level becomes close to 70% while the battery module is charged, the battery module is controlled so as not to be overcharged. In addition, when the SOC level becomes close to 50% while the battery module is discharged, the battery module is controlled so as not to be over-discharged.

To appropriately perform the SOC control operation, it is necessary to accurately calculate the SOC level of the secondary battery being charged and discharged.

Conventional SOC calculation methods for commercialized batteries are classified according to a reference value for determining the SOC.

The conventional SOC calculation methods include: an AH method which calculates the SOC by using a relationship between the current used (amperes) and time, a voltage estimation method which measures an Open Circuit Voltage (OCV) to calculate the SOC by using a relationship between the measured OCV and the SOC, and a resistance estimation method which calculates the SOC by using a relationship between the SOC and an Internal Resistance drop (IR-drop) of the battery.

However, in the AH method, there is a problem in that the SOC according to a load condition of the battery module may not be displayed and an SOC level error is increased by a charge/discharge current sensing error. Accordingly, it is difficult to use the AH method alone in a Hybrid Electric Vehicle (HEV) since the amount and direction of the currents vary more frequently than in an Electric Vehicle (EV). In the voltage estimation method, there is a problem in that variations occur for various reasons, such as an instant current, temperature, and degradation of the battery.

SUMMARY OF THE INVENTION

The present invention has been made in an effort to provide a battery management system for accurately calculating a State of Charge (SOC) of a battery and a driving method thereof.

An exemplary battery management system of a secondary battery having a plurality of unit batteries includes: a sensing unit, a controller, an Open Circuit Voltage (OCV) calculator, and a State of Charge (SOC) determining unit. The sensing unit measures an overall voltage of the secondary battery. The controller maintains the secondary battery at an open circuit state for a first period of time after a power supply switch is turned on, and couples the secondary battery to an external device when the first period of time ends. The OCV calculator receives the measured voltage from the sensing unit and calculates an OCV of the secondary battery during the first period of time. The SOC determining unit receives the OCV from the OCV calculator and determines an SOC corresponding to the OCV.

An exemplary driving method of a battery management system according to an embodiment of the present invention determines a State of Charge (SOC) of a secondary battery having a plurality of unit batteries. In the exemplary driving method, the secondary battery is maintained at an open circuit state for a first period of time after a power supply switch is turned on. An Open Circuit Voltage (OCV) is then measured during the first period of time and the SOC corresponding to the OCV is then determined.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

With reference to the accompanying drawings, the present invention is described in detail below in order for those skilled in the art to be able to implement the present invention. As those skilled in the art would realize, the described embodiments can be modified in various different ways, all without departing from the spirit or scope of the present invention.

Figure 1:
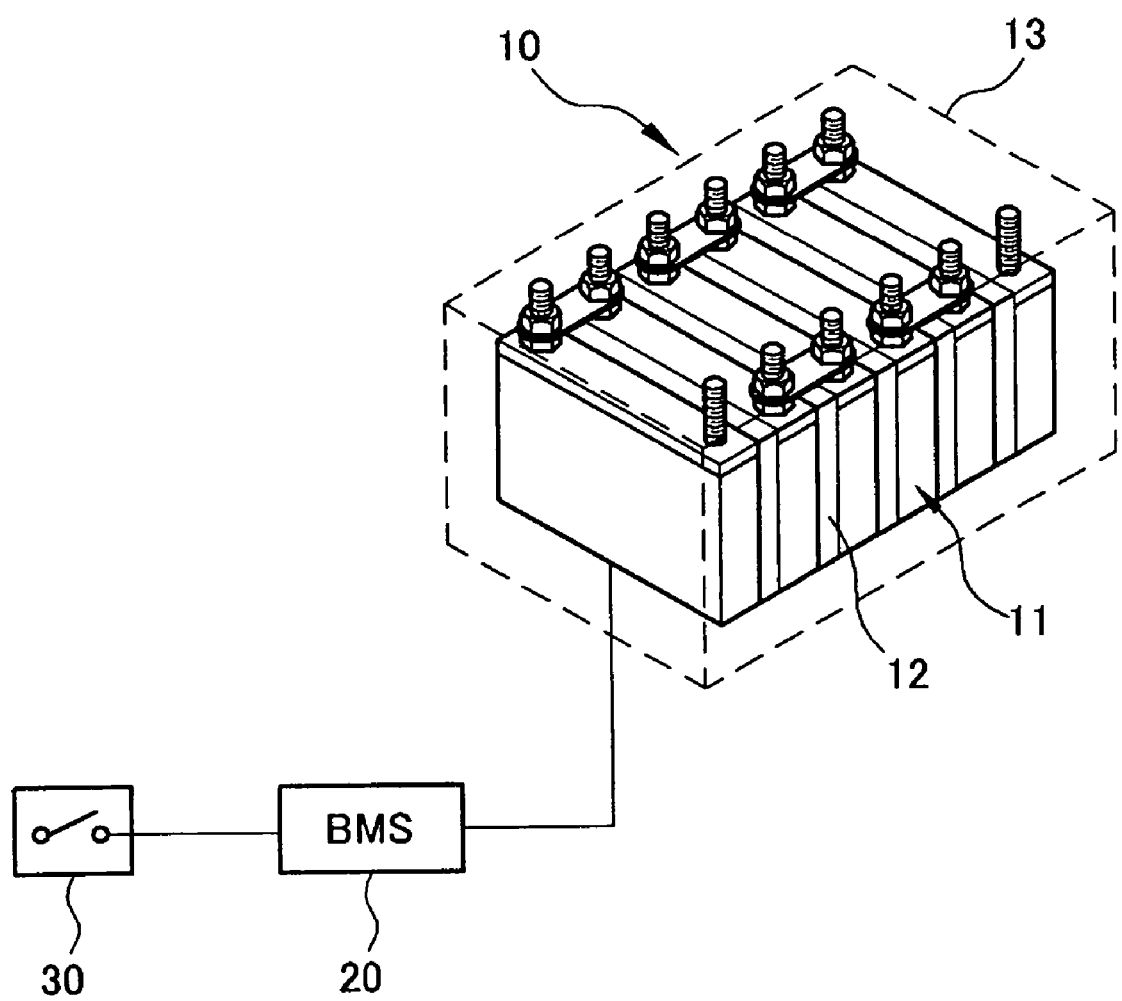
FIG. 1 is a diagram of a configuration of a secondary battery module according to an exemplary embodiment of the present invention.

FIG. 1 is a diagram of a configuration of a secondary battery module and a Battery Management System (BMS) according to an exemplary embodiment of the present invention.

Referring to FIG. 1, a secondary battery module 10 according to the exemplary embodiment of the present invention is a large capacity battery module, and includes at least one battery stack having a plurality of sequentially arranged unit spaced apart batteries 1, and a housing 13 containing the at least one battery stack and a coolant flowing therethrough.

The unit batteries 11 each include a plurality of membrane-electrode assemblies respectively including an anode plate and a cathode plate, wherein adjacent membrane-electrode assemblies are separated by separators. Each unit battery 11 is formed as a conventional secondary battery for charging and discharging a predetermined level of power. The battery stack according to the exemplary embodiment of the present invention includes the unit batteries 11 arranged in series.

According to the exemplary embodiment of the present invention, the battery stack is formed such that the respective unit batteries 11 having a rectangular shape are arranged to be upright (the rectangular shape of each is wide such that a pair of long sides and a pair of short sides are provided in the exemplary embodiment of the present invention). Each unit battery can have a cylindrical shape rather than having the rectangular shape.

The battery stack includes separators 12 between the respective batteries 11 and on the most external unit battery 11. The separators 12 facilitate uniform spacing of the unit batteries 11, allow air communication for temperature control, and support the sides of the respective unit batteries 11.

The BMS 20 according to the exemplary embodiment of the present invention measures the temperature, current, and voltage of the respective unit batteries 11 of the battery module 10, and manages the secondary battery using the measured values. In addition, according to a turn-on signal of an ignition switch of a vehicle, the BMS 20 maintains the battery module 10 as an open circuit for a predetermined time rather than immediately coupling the battery module to external devices including a motor. A charge/discharge current does not flow to the battery module 10 in an open circuit state, and an Open Circuit Voltage (OCV) is calculated while the current is not flowing. The above predetermined time is set to be enough to calculate the OCV according to the exemplary embodiment of the present invention. Hereinafter, the predetermined time will be referred to as an open circuit maintaining period.

A power supply switch (e.g., an ignition switch of a vehicle) 30 is electrically coupled to the BMS 20. When the power supply switch 30 is turned on, the BMS is notified thereof and it maintains the battery module 10 in an open circuit state during the open circuit maintaining period.

The BMS is described in further detail below with reference to FIG. 2.

Figure 2:
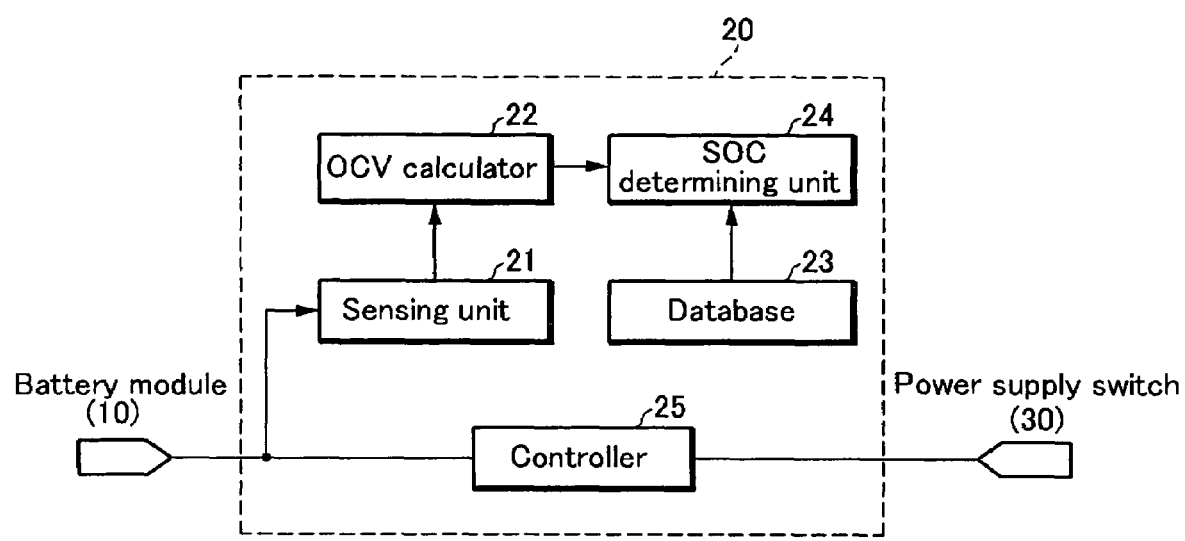
FIG. 2 is a diagram of a configuration of a Battery Management System (BMS) according to an exemplary embodiment of the present invention.

FIG. 2 is a diagram of a configuration of the BMS 20 according to the exemplary embodiment of the present invention.

As shown in FIG. 2, the BMS 20 includes a sensing unit 21, an OCV calculator 22, a database 23, an SOC determining unit 24, and a controller 25.

The sensing unit 21 measures an overall voltage of the battery module 10. In addition, when the power supply switch 30 is turned on, the sensing unit 21 repeatedly measures the overall voltage of the battery module 10 during the open circuit maintaining period, and transmits the measured voltage to the OCV calculator 22.

The OCV calculator 22 calculates an OCV by using the overall voltage received from the sensing unit 21. In addition, the OCV calculator 22 receives the voltages that are repeatedly measured by the sensing unit 21 during the open circuit maintaining period, and can calculate the OCV as an average thereof.

The database 23 generates a relationship between the OCV of the battery module 10 and an SOC value corresponding to the OCV by using a Boltzmann equation, and stores a calculation result as data mapped in a table. Equation 1 is the Boltzmann equation for calculating the SOC value corresponding to the OCV.

$$SOC[\%] = \frac{A_1 - A_2}{1 + e^{\frac{V_{ocv} - V_o}{V_s}}} + A_2 \qquad \text{Equation 1}$$

In Equation 1, A1 denotes the SOC value when the OCV value is $-\infty$, and A2 denotes the SOC value when the OCV value is $+\infty$. Vocv denotes a measured OCV value, and Vo denotes a center value obtained as (A1+A2)/2. Vw denotes a value in a predetermined range with a center of the Vo, and the predetermined range is obtained in a table mapping process. The A1, A2, Vw, and Vo values are predetermined values. As the OCV value is measured and the SOC value corresponding to the OCV is calculated by using Equation 1, the OCV and SOC values can be mapped in a table.

The SOC determining unit 24 receives the OCV of the battery module 10 which is calculated by the OCV calculator 22, and detects the SOC value corresponding to the OCV from the database 23.

The controller 25 is notified that the power supply switch 30 is turned on, maintains the battery module 10 at a no-load state for a predetermined time, and couples the battery module 10 to external devices such as the motor when the open circuit maintaining period ends. The predetermined time of the BMS 20 according to the exemplary embodiment of the present invention can be set to be one second, but the present invention is not limited thereto. In addition, the controller 25 can include a timer for detecting the predetermined time.

A driving method of the BMS 20 according to an exemplary embodiment of the present invention for calculating an initial SOC of the battery module 10 is described as follows.

Figure 3:
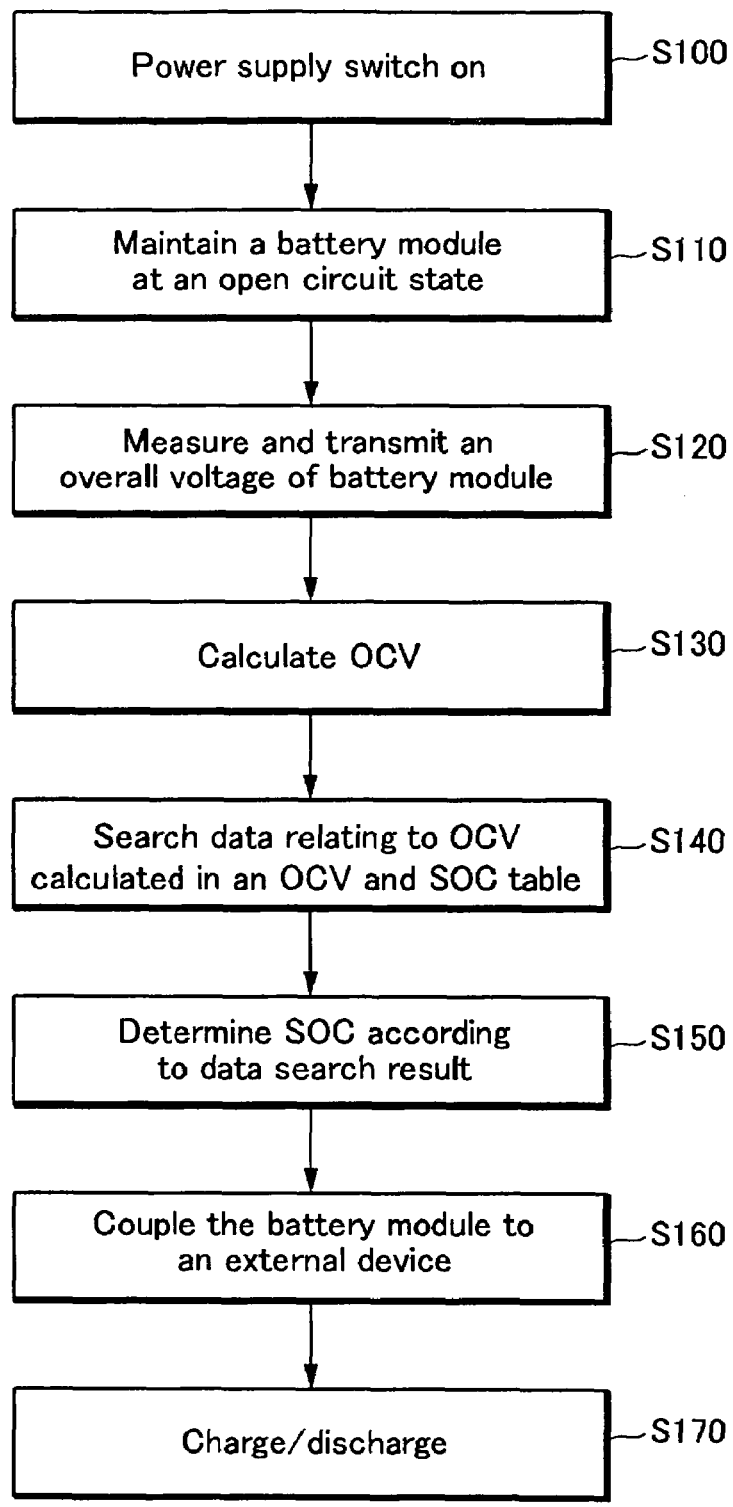
FIG. 3 is a flowchart of a driving method of the BMS according to an exemplary embodiment of the present invention.

FIG. 3 is a flowchart of a driving method of the BMS 20 according to an exemplary embodiment of the present invention.

When the power supply switch 30 is turned on in step S100, the controller 25 is notified thereof, and delays coupling the battery module to the external device. Then, the battery module 10 is maintained at the open circuit state for the predetermined time in step S110. While the battery module 10 is in the open circuit state, currents are interrupted. While a delay time caused by the BMS 20 according to the exemplary embodiment of the present exemplary can be set to be one second, it is not limited thereto. In addition, when the battery module 10 is in the open circuit state and coupling to the external device is delayed for one second, the SOC can be determined by the following processes.

The sensing unit 21 measures an overall voltage of the battery module during the open circuit maintaining period, and transmits the voltage to the OCV calculator 22 in step S120.

In step S130, the OCV calculator 22 calculates the OCV by using the overall voltage of the battery module received from the sensing unit 21.

Subsequently in step S140, the SOC determining unit 24 receives the OCV from the OCV calculator 22, and searches data relating to the received OCV from a data table stored in the database 23.

Then in step S150, the SOC determining unit 24 retrieves the SOC corresponding to the OCV according to the data search result, and determines the SOC.

As described above, the current flowing to the battery module 10 is interrupted for the predetermined time when the power supply switch 30 is turned on, and the OCV value in the no-load state is calculated during the delay time so a more accurate SOC value can be calculated.

In addition, the controller 25 couples the battery module 10 to external devices after the open circuit maintaining period in step S160.

Accordingly, the battery module 10 is coupled to the external devices including the motor, and a charge or discharge operation is appropriately performed in step S170.

The battery module according to the exemplary embodiment of the present invention can be efficiently used for an HEV requiring high output and large capacity performance, but it is not limited thereto.

While the present invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

According to the exemplary embodiment of the present invention, since the OCV value is accurately measured when the power supply switch is turned on, the SOC value corresponding to the OCV value can be accurately obtained. In addition, since the accurate SOC value is detected, the battery stability is increased, and the charge/discharge operations are more appropriately performed.

What is claimed is:

1. A battery management system of a secondary battery having a plurality of unit batteries, the battery management system comprising:
   a sensing unit adapted to measure an overall voltage of the secondary battery;
   a controller adapted to maintain the secondary battery in an open circuit state for a first period of time when a power supply switch is turned on, and to couple the secondary battery to an external device upon the first period of time ending;
   an Open Circuit Voltage (OCV) calculator adapted to receive the measured overall voltage from the sensing unit, measured only when the secondary battery is in an open circuit state, and to calculate an OCV of the secondary battery during the first period of time when the secondary battery is in an open circuit state; and
   a State of Charge (SOC) determining unit adapted to receive the calculated OCV from the OCV calculator and to determine an SOC corresponding to the OCV.

2. The battery management system of claim 1, wherein the first period of time is greater than or equal to a period of time required for calculating the OCV.

3. The battery management system of claim 1, further comprising a database adapted to store data of the SOC corresponding to the OCV as a table.

4. The battery management system of claim 3, wherein the database is adapted to calculate the data of the SOC corresponding to the OCV using a Boltzmann equation, and to store a calculation result obtained by calculating the data of the SOC corresponding to the OCV using a Boltzmann equation.

5. The battery management system of claim 1, wherein the controller comprises a timer adapted to measure the first period of time.

6. The battery management system of claim 1, wherein the sensing unit is adapted to repeatedly measure the overall voltage during the first period of time when the secondary battery is in an open circuit state, and wherein the OCV calculator is adapted to calculate the OCV as an average of the repeatedly measured overall voltages of the secondary battery when the secondary battery is in an open circuit state.

7. A method of driving a battery management system to determine a State of Charge (SOC) of a secondary battery having a plurality of unit batteries, the method comprising:
   a) maintaining the secondary battery in an open circuit state for a first period of time after a power supply switch is turned on;
   b) measuring an Open Circuit Voltage (OCV) during the first period of time when the secondary battery is in an open circuit state; and
   c) determining the SOC corresponding to the OCV.

8. The method of claim 7, wherein the SOC corresponding to the measured OCV is determined using data of the SOC corresponding to the OCV stored in advance.

9. The method of claim 7, wherein the first period of time is sufficient to measure the OCV.

10. The method of claim 9, wherein the overall voltage of the secondary battery is repeatedly measured during the first period of time when the secondary battery is in an open circuit state, and wherein the OCV is calculated as an average of a plurality of measured voltages of the secondary battery when the secondary battery is in an open circuit state.

* * * * *

UNITED STATES PATENT AND TRADEMARK OFFICE
CERTIFICATE OF CORRECTION

| | | |
|---|---|---|
| PATENT NO. | : 7,656,124 B2 | Page 1 of 1 |
| APPLICATION NO. | : 11/480532 | |
| DATED | : February 2, 2010 | |
| INVENTOR(S) | : Seo et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 537 days.

Signed and Sealed this

Twenty-eighth Day of December, 2010

David J. Kappos
*Director of the United States Patent and Trademark Office*